(12) United States Patent
Lo

(10) Patent No.: US 7,401,642 B2
(45) Date of Patent: Jul. 22, 2008

(54) HEAT SINK WITH HEAT PIPES

(75) Inventor: Wei-Ta Lo, Tu-chen (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 681 days.

(21) Appl. No.: 10/948,519

(22) Filed: Sep. 22, 2004

(65) Prior Publication Data

US 2005/0133199 A1 Jun. 23, 2005

(30) Foreign Application Priority Data

Dec. 19, 2003 (CN) .................. 2003 2 01197809 U

(51) Int. Cl.
*H05K 7/20* (2006.01)
*F28D 15/02* (2006.01)
(52) U.S. Cl. .................. 165/80.3; 165/104.33; 361/700
(58) Field of Classification Search ............ 165/104.33; 361/697, 700
See application file for complete search history.

(56) References Cited

U.S. PATENT DOCUMENTS

| 5,699,853 | A | 12/1997 | Goth et al. | |
|---|---|---|---|---|
| 6,625,021 | B1 | 9/2003 | Lofland et al. | |
| 6,830,098 | B1 * | 12/2004 | Todd et al. | 165/104.33 |
| 6,915,844 | B2 * | 7/2005 | Chou | 165/104.33 |
| 6,938,682 | B2 * | 9/2005 | Chen et al. | 165/104.33 |
| 2001/0001981 | A1 | 5/2001 | Ueda et al. | |
| 2003/0141041 | A1 * | 7/2003 | Chen | 165/80.3 |
| 2004/0226697 | A1 * | 11/2004 | Liu | 165/104.33 |
| 2005/0098304 | A1 * | 5/2005 | Lin et al. | 165/104.33 |

FOREIGN PATENT DOCUMENTS

| CN | 2514400 Y | 10/2002 |
|---|---|---|
| TW | 467312 | 12/2001 |
| TW | 474558 | 1/2002 |

\* cited by examiner

*Primary Examiner*—Allen J Flanigan
(74) *Attorney, Agent, or Firm*—Wei Te Chung

(57) ABSTRACT

A heat sink for dissipating heat generated by an integrated circuit package includes a flat base 10, two vertical U-shaped heat pipes 20 and a heat dissipation body. The heat dissipation body includes a pair of side plates 40 and a plurality of fins 50 sandwiched between the side plates 40. Each heat pipe 20 has a horizontal heat absorbing portion 22 attached to the base 10, and two heat dissipation portions 24 extending perpendicularly from opposite ends of the heat absorbing portion 22 and through the side plates 40.

11 Claims, 6 Drawing Sheets

HEAT SINK WITH HEAT PIPES

BACKGROUND OF THE INVENTION

1. Field of the Invention

The present invention relates generally to a heat sink and in particular, relates to a heat sink with heat pipes for integrated circuit package in computer system.

2. Prior Art

Continuing development of integrated circuits technology has result in that integrated circuit packages such as central processing units (CPUs) operates at a more and more high speed. Heat generated by these modern integrated circuit packages has increased commensurately. Accumulation of heat will bring on an increasing of temperature of the integrated circuit packages; consequently, result in an instability of operation or being damaged. For above reason, the heat generated by their operation must be efficiently removed in order to maintain the temperature of the integrated circuits packages within limits that will keep the operating parameters of the packages within predetermined ranges, and also prevent destruction of the device by overheating.

Various heat sink configurations for heat dissipation of integrated circuit packages are developed. For example, Taiwan patent application Nos. 89214786 and 89213022 each discloses a conventional heat sink with a base for contacting an integrated circuit package and a plurality of fins arranged on the base. Most of heat generated by the integrated circuit package is conducted to the base, and then conducted upwardly from the base to the fins. However, the fins absorb the heat from the base through a single thermal conductive path. Heat cannot be speedily transferred from the base to the fins, which results in overheating of the base. Thus, the heat generated by the integrated circuit package cannot be efficiently dissipated by the heat sink.

In order to overcome above-mentioned shortcomings, a kind of heat sink with heat pipes is designed and employed. Referring to FIG. 6, the heat sink has a base 100, two vertical U-shaped heat pipes 200 installed on the base 100 and a plurality of parallel fins 300 through which the heat pipes 200 extend. The heat sink absorbs heat generated by an integrated circuit package (not shown) by means of the base 100. Heat is transferred to the fins 300 via the heat pipes 200 for further heat dissipation. Heat accumulated in the base 100 can be speedily transferred to the fins 300 under the high thermal conductivity of the heat pipes 200, which avoids overheating of the base 100.

However, the heat pipe 200 usually has a small diameter, thus, contacting area between the heat pipes 200 and the fins 300 is limited. Moreover, the heat pipes 200 are mostly connected to the fins 300 by soldering. Operation of soldering between closed circular edges in the fins 300 and a circumference of a small-diameter heat pipe 200 is difficult. Heat conduction efficiency from the heat pipes 200 to the fins 300 is greatly affected by the quality of soldering. Consequently, heat cannot be efficiently conveyed from the heat pipes 200 to the fins 300, and utilization rate of the fins 300 is still low. Heat dissipation efficiency of the heat sink is limited.

SUMMARY OF THE INVENTION

Accordingly, an object of the present invention is to provide a heat sink which can efficiently dissipate heat for integrated circuit packages.

To achieve the above-mentioned object, a heat sink in accordance with a first preferred embodiment of the present invention includes a flat base, a heat dissipation body and a pair of vertical U-shaped heat pipes. The heat dissipation body includes a pair of side plates and a plurality of fins sandwiched between the side plates. Each heat pipe has a horizontal heat absorbing portion attached to the base, and two heat dissipation portions extending perpendicularly from opposite ends of the heat absorbing portion and attached to the side plates.

A heat sink in accordance with a second preferred embodiment of the present invention is similar to the heat sink of the first embodiment except that two pairs of L-shaped heat pipes is applied instead of a pair of U-shaped heat pipes. Each heat pipe has a horizontal heat absorbing portion attached to the base and a heat dissipation portion extending from one end of the heat absorbing portion and attached to the side plate.

Alternatively, the two heat dissipation portions of each U-shaped heat pipe of the first preferred embodiment respectively extend through one of the side plates and the fins.

Other objects, advantages and novel features of the present invention will be drawn from the following detailed description of the preferred embodiment of the present invention with attached drawings, in which:

DESCRIPTION OF THE PREFERRED EMBODIMENTS

Figure 1:
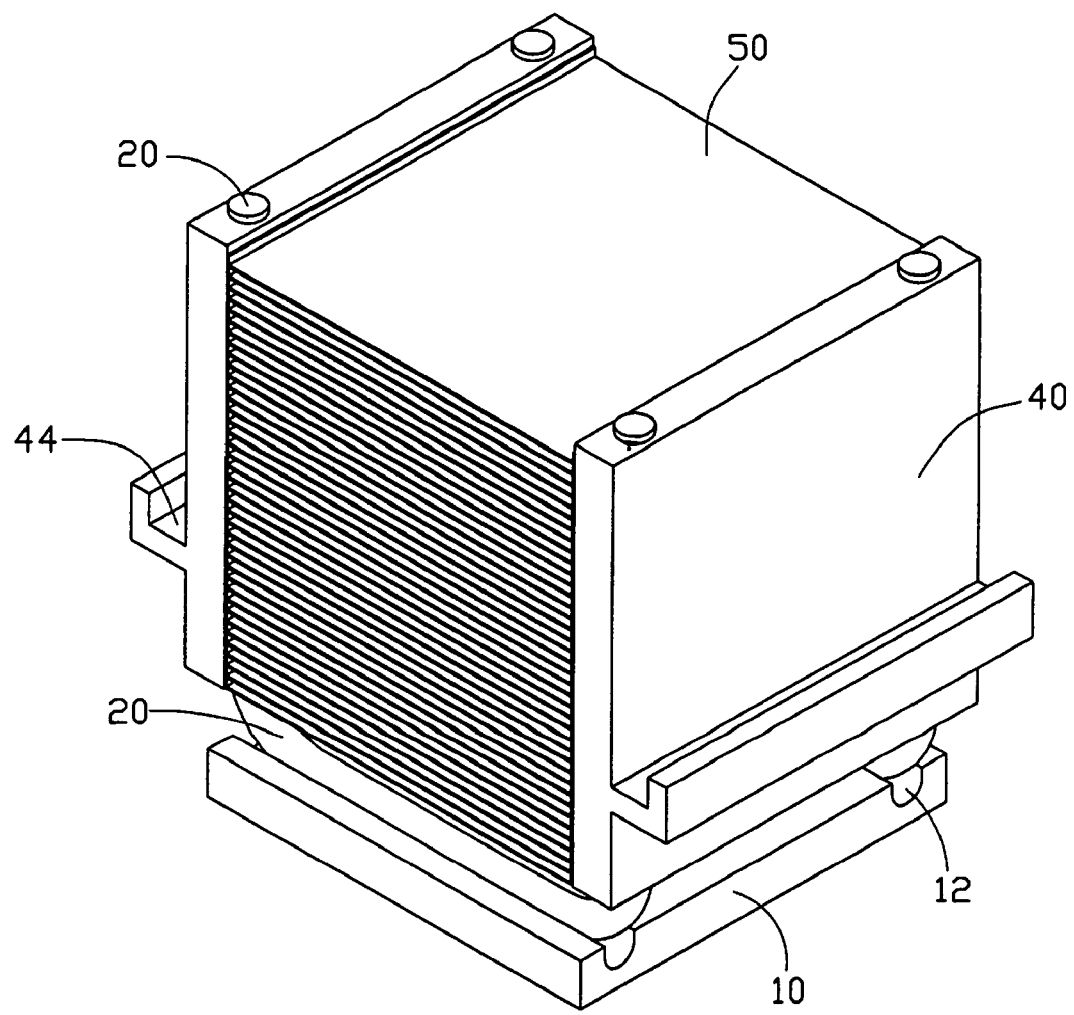
FIG. 1 is an assembled, isometric view of a heat sink in accordance with a first preferred embodiment of the present invention.
Figure 2:
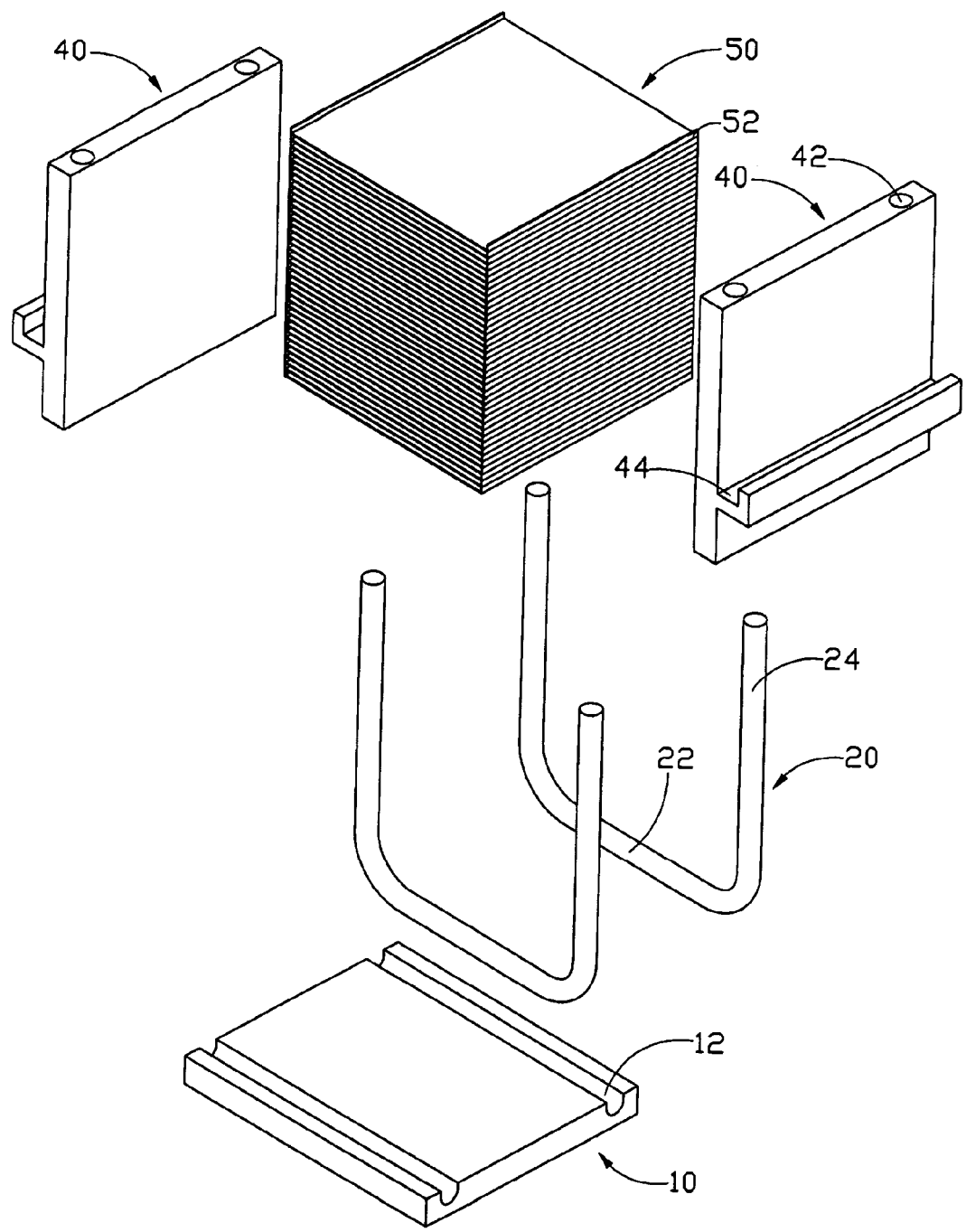
FIG. 2 is an exploded, isometric view of the heat sink of FIG. 1.

Referring to FIG. 1 and FIG. 2, a heat sink in accordance with a preferred embodiment of the invention used to be mounted on an integrated circuit package (not shown), such as a CPU, in computer system for heat dissipation.

The heat sink comprises a flat base 10, a pair of heat pipe units attached to the base 10 and a heat dissipation body attached to the heat pipe units. Each member of the heat sink of the invention is made of metallic material.

The base 10 is a rectangle flat plate having a bottom surface (not labeled) contacting with the integrated circuits package and a top surface (not labeled) defining two parallel semi-circle-section grooves 12.

The pair of heat pipe units comprises a pair of U-shaped heat pipes 20. Each heat pipe 20 has a horizontal heat absorbing portion 22 fittingly received in a corresponding groove 12 of the base 10, and two heat dissipation portions 24 extending perpendicularly from opposite ends of the heat absorbing portion 22. A suitable amount of working liquid (no shown) is sealed in each heat pipe 20. When heated, the working liquid in the heat absorbing portion 22 of the heat pipe 20 evaporates into gas phase and coagulates into liquid phase in the heat dissipation portions 24 and flows back to the heat absorbing portion 22. Heat is therefore transferred from the absorbing portions 22 of the heat pipes 20 to the heat dissipation portions 24 for further dissipation.

The heat dissipation body includes a pair of vertical side plates 40 facing toward each other and a plurality of spaced horizontal fins 50 sandwiched between the side plates 40. A pair of longitudinal perforations 42 for receiving the heat dissipation portions 24 of the corresponding heat pipes 20 is defined in each side plate 40. The heat pipes 20 are fixedly received in the perforations 42 of the side plates 40 by soldering or via thermal grease. A pair of hems 52 is formed at opposite sides of each fin 50 by bending and contacts with the corresponding side plates 40. A plurality of airflow channels is formed between adjacent fins 50. A platform 44 for supporting a clip (not shown) used to clamp the heat sink to the integrated circuit package protrudes outwardly and horizontally from each side plate 40.

A fan (no shown) can be mounted on a side face of the heat sink which is perpendicular to the fins 50 and the side plates 40 for providing a strong compelling airflow in order to enhance cooling performance of the heat sink.

In use, the heat sink absorbs heat from the integrated circuit package by means of the base 10 in contact with the integrated circuits package, and transfers it to the side plates 40 by means of the heat pipes 20. The side plates 40 transfer the heat to the fins 50 for dissipation.

Figure 6:
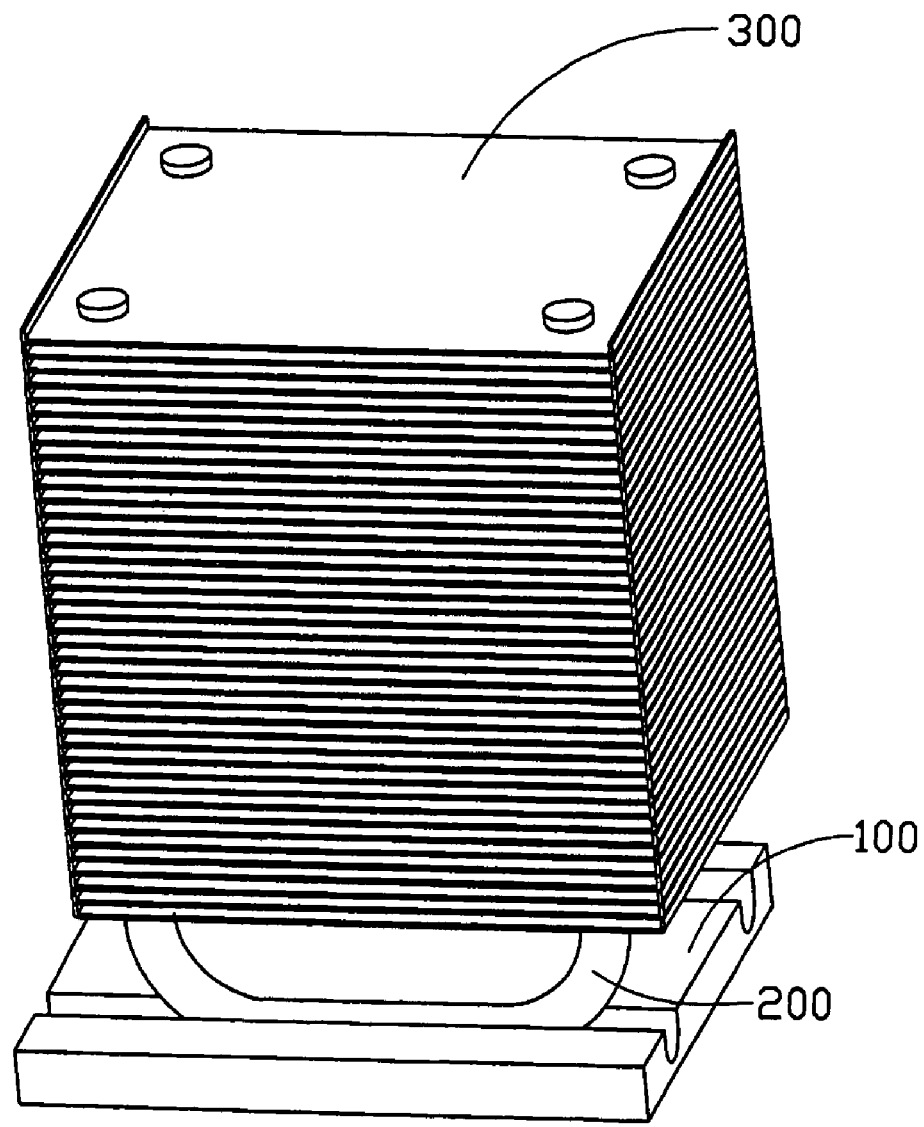
FIG. 6 is an isometric view of a conventional heat sink.

In the first embodiment of the present invention, it is easier soldering between the heat pipes 20 and the side pates 40 than that between the heat pipes 200 and the fins 300 in the prior art (as shown in FIG. 6). Thermal jointing between the heat pipes 20 and the side plates 40 is better than that between the heat pipes 200 and the fins 300 in prior art. Contacting area between the side plates 40 and the fins 50 is much greater than that between the heat pipes 200 and the fins 300 of the prior art. Therefore, heat can be transferred from the heat pipes 20 to the fins 50 via the side plates 40 more effectively. Utilization rate of the fins 50 and the heat pipes 20 are increased and overheating of the base 10 is avoiding. The whole cooling performance of the heat sink is greatly enhanced.

Figure 3:
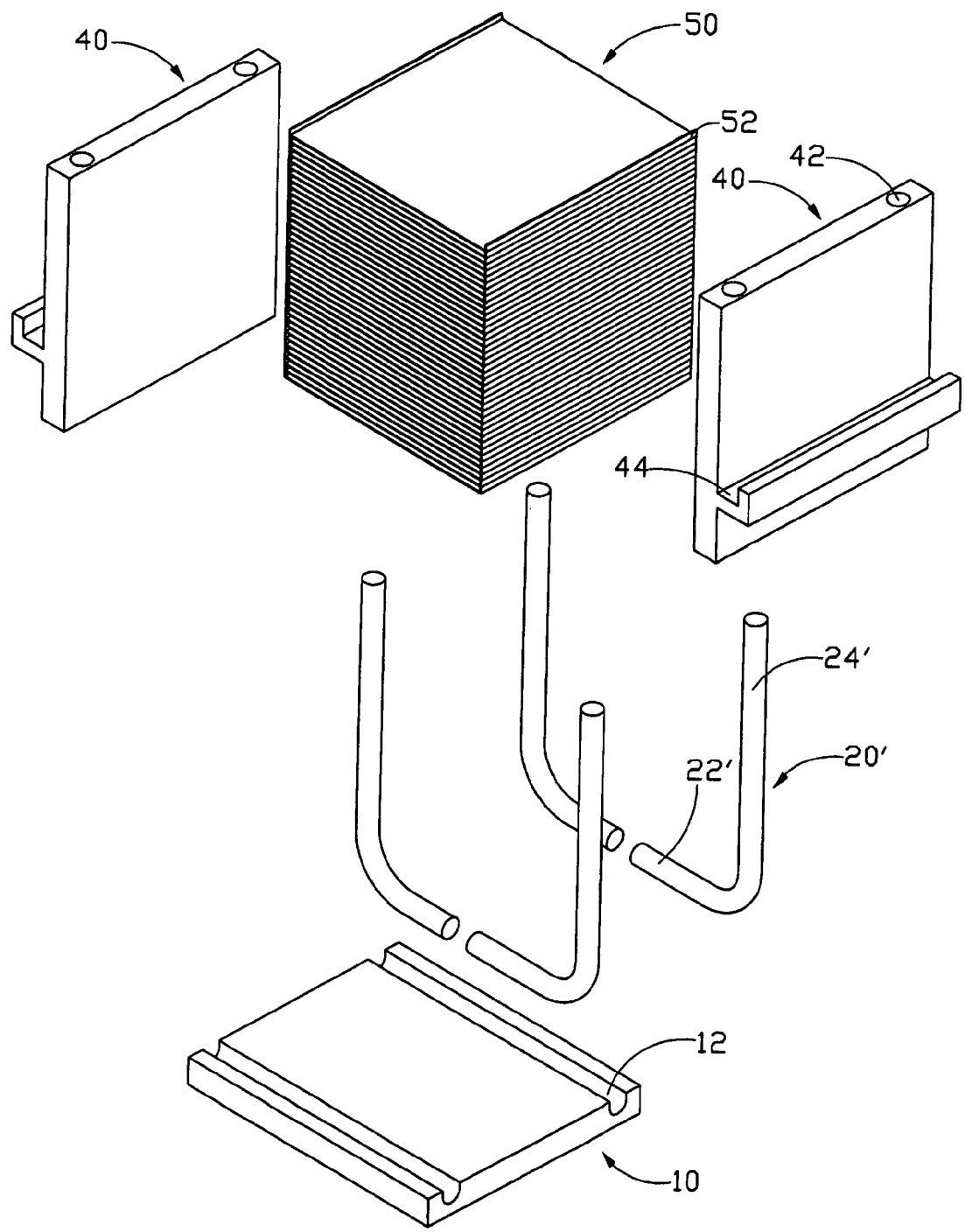
FIG. 3 is an exploded, isometric view of a heat sink in accordance with a second preferred embodiment of the present invention.

FIG. 3 shows a heat sink in accordance with a second preferred embodiment of the invention. The heat sink of the second embodiment is similar to the heat sink of the first embodiment except for the heat pipe unit. The heat pipe unit of the second embodiment comprises a pair of L-shaped heat pipes 20'. Each heat pipe 20' has a horizontal heat absorbing portion 22' and a vertical heat dissipation portion 24' extending from one end of the heat absorbing portion 22'. The heat absorbing portion 22' of the heat pipe 20' is attached to the base 10, and the heat dissipation portions 24' of the heat pipe 20' is attached to a corresponding side plate 40. It has the same cooling performance as the first embodiment.

Figure 4:
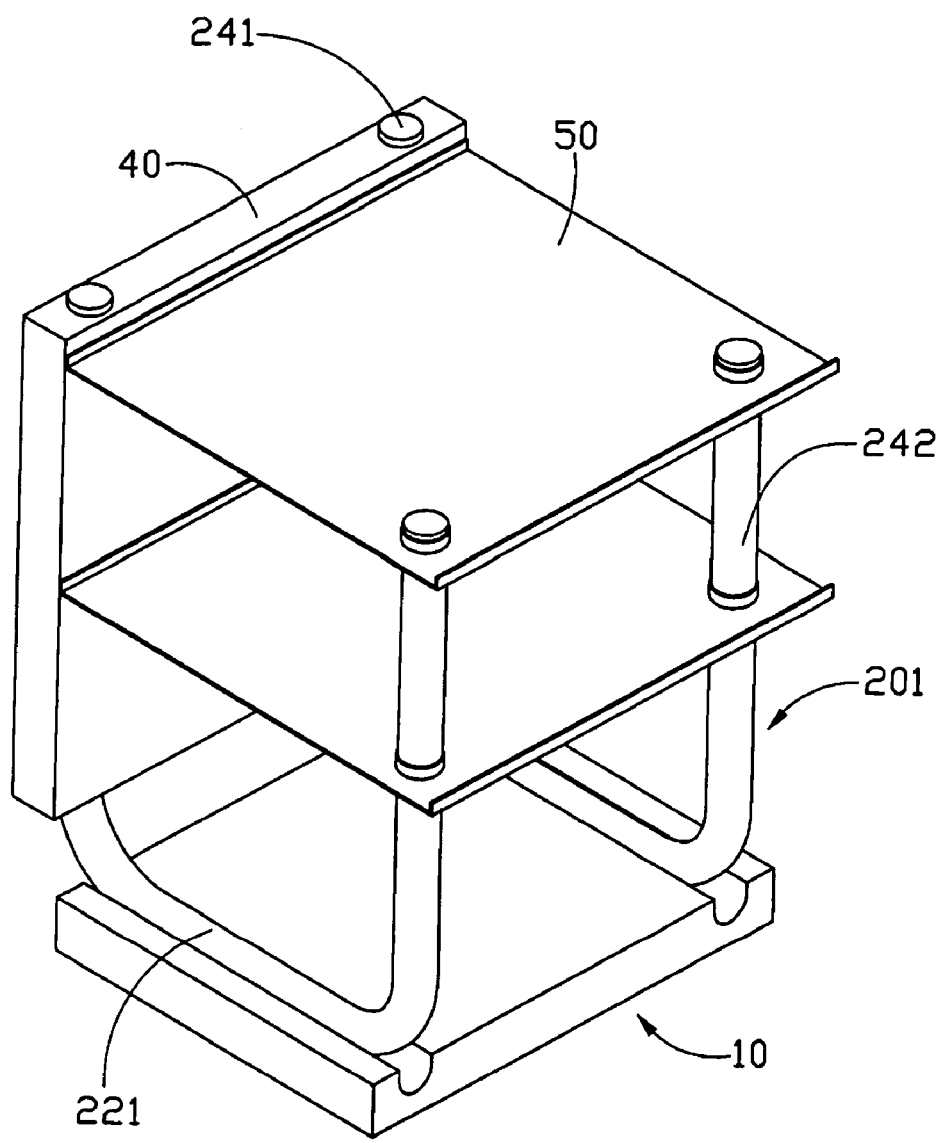
FIG. 4 is an assembled, isometric view of a heat sink in accordance with a third preferred embodiment of the present invention, but only two fins shown.

Referring to FIG. 4, a heat sink in accordance with a third preferred embodiment of the invention is illustrated. The heat sink comprises a pair of U-shaped heat pipes 201 and a side plate 40. Each heat pipe 201 has a heat absorbing portion 221 and first and second heat dissipation portions 241, 242 extending from opposite ends of the heat absorbing portion 221. The heat absorbing portions 221 of the heat pipes 201 are attached to a base 10. The first heat dissipation portion 241 extends through the side plate 40. The second heat dissipation portion 242 extends through a plurality of fins 50 arranged above the base 10 and attached to the side plate 40. Cooling performance of the heat sink is lower than that of the first and second preferred embodiments but higher than that of the prior art.

Figure 5:
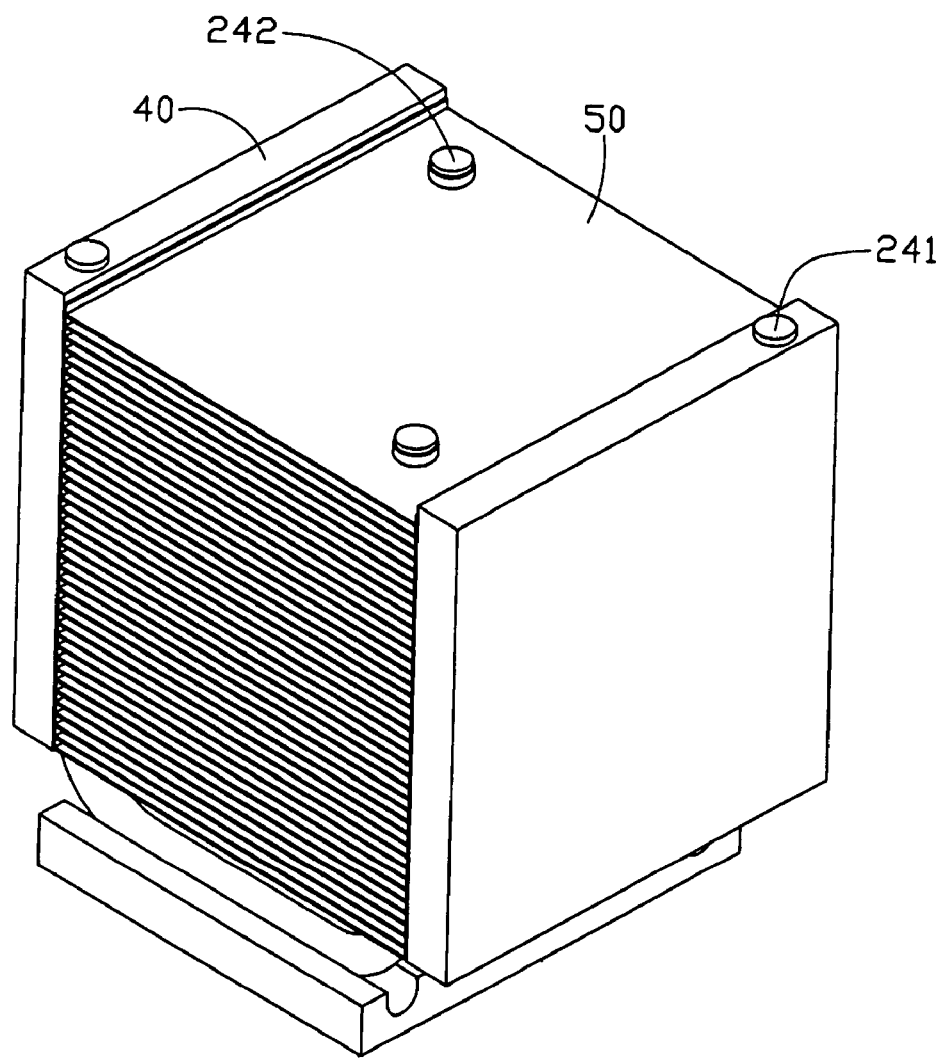
FIG. 5 is an assembled, isometric view of a heat sink in accordance with a fourth preferred embodiment of the present invention.

Referring to FIG. 5, a heat sink in accordance a fourth preferred embodiment of the invention as an improvement of the third preferred embodiment is illustrated. A pair of side plates 40 and a pair of U-shaped heat pipes are applied. One heat dissipation portion 241 of one of the U-shaped heat pipes extends through one of the side plates 40, and the other heat dissipation portion 242 extends through the fins 50. One heat dissipation portion 241 of the other one of the U-shaped heat pipes 221 extends through the other one of the side plates 40, and the other heat dissipation portion 242 extends through the fins 50.

In alternative, the perforation 42 of the invention can be replaced by grooves formed in the side plates 40. The operation of soldering between the heat pipes 20 (or 20' or 201) and the side plates 40 is much easier. The fins 50 may be also integrally formed with the side plates 40.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

What is claimed is:

1. A heat sink for integrated circuit package comprising:
a heat receiving member,
a heat pipe unit attached to the heat receiving member, the heat pipe unit comprising a pair of heat dissipation portions extending away from the heat receiving member,
a pair of side plates attached to the heat dissipation portions of the heat pipe unit respectively; and
a plurality of spaced fins sandwiched between the side plates for dissipating heat transferred from the side plates, wherein the plurality of spaced fins are perpendicular to the pair of side plates.

2. The heat sink as claimed in claim 1, wherein the heat pipe unit comprises a U-shaped heat pipe.

3. The heat sink as claimed in claim 2, wherein the heat pipe comprises a heat absorbing portion attached to the heat receiving member, said pair of heat dissipation portions extending from opposite ends of the heat absorbing portion.

4. The heat sink as claimed in claim 3, wherein the heat receiving member defines a groove in which the heat absorbing portion of the heat pipe is received.

5. The heat sink as claimed in claim 1, wherein the heat pipe unit comprises a pair of L-shaped heat pipes.

6. The heat sink as claimed in claim 5, wherein each of the heat pipes comprises a horizontal heat absorbing portion attached to the heat receiving member, and one of the heat dissipation portions extending perpendicularly from one end of the heat absorbing portion.

7. The heat sink as claimed in claim 1, wherein a pair of hems is formed at opposite sides of each fin by bending and in contact with the side plates respectively.

8. The heat sink as claimed in claim 1, wherein the fins are arranged above and substantially parallel to the heat receiving member.

9. The heat sink as claimed in claim 1, wherein the side plates are substantially perpendicular to the heat receiving member.

10. The heat sink as claimed in claim 1, wherein the beat dissipation portions of the heat pipe unit are respectively inserted into the pair of side plates and spaced from the plurality of spaced fins.

11. The heat sink as claimed in claim 1, wherein the pair of side plates each define a longitudinal perforation to receive a corresponding beat dissipation portion of the beat pipe unit.

* * * * *